United States Patent [19]

Ronn et al.

[11] Patent Number: 4,743,463
[45] Date of Patent: May 10, 1988

[54] METHOD FOR FORMING PATTERNS ON A SUBSTRATE OR SUPPORT

[75] Inventors: Avigdor M. Ronn, Great Neck; Leonard F. Hurysz; Alan P. Van Kerkhove, both of Rochester, all of N.Y.

[73] Assignee: Eastman Kodak Company, Rochester, N.Y.

[21] Appl. No.: 831,786

[22] Filed: Feb. 21, 1986

[51] Int. Cl.$^4$ ............................ B05D 3/06; D06P 5/20
[52] U.S. Cl. ........................................ 427/53.1; 8/444; 8/523; 427/99
[58] Field of Search ................................. 427/53.1, 99; 219/121 L, 121 LE, 121 LF, 121 LM; 8/444, 522, 523

[56] References Cited

U.S. PATENT DOCUMENTS

| | | | |
|---|---|---|---|
| 3,560,258 | 2/1971 | Brisbane | 430/319 |
| 4,201,821 | 5/1980 | Fromson et al. | 8/444 X |
| 4,595,647 | 6/1986 | Spanjer | 427/53.1 X |

FOREIGN PATENT DOCUMENTS 221401  4/1985  German Democratic Rep. ............................ 219/121 LM Primary Examiner—Evan K. Lawrence
Attorney, Agent, or Firm—John R. Everett

[57] ABSTRACT

A method of forming a predetermined pattern on a substrate or support. In one embodiment, the method comprises the steps of:
(a) providing a laser beam having sufficient power to vaporize a specified pattern-forming material;
(b) providing an assembly comprising (i) a substrate which is transparent to the laser and which forms an intimate contact interface with (ii) a smooth layer of the selected pattern-forming material;
(c) focusing the laser beam through the substrate at or near the interface of the pattern-forming material; and
(d) moving the substrate and the laser beam relative to each other according to the predetermined pattern to selectively deposit the pattern-forming material on the substrate according to the predetermined pattern.

12 Claims, 1 Drawing Sheet

METHOD FOR FORMING PATTERNS ON A SUBSTRATE OR SUPPORT

FIELD OF THE INVENTION

The present invention relates to a method of forming patterns on a substrate or support and to elements formed according to such method.

BACKGROUND OF THE INVENTION

A method for forming patterns from metal films with resolution in the micrometer range is of great interest to manufacturers of electronic, optical and magnetic devices. Conventional approaches depend on multistep processes such as photolithography for pattern definition, film deposition and lift off or etching.

One method for forming metal patterns on a substrate is disclosed in U.S. Pat. No. 3,560,258. In the method, a base member and a substrate having a layer of vaporizable material therebetween is provided. A relatively small part of the layer situated in the immediate vicinity of the focus of a converging beam of intense radiant energy is locally heated. The local heating is sufficient to evaporate the layer. The resulting vapor condenses on the substrate. Relative movement between the radiant energy beam and the substrate in accordance with a pattern results in a laser written pattern on the substrate. The method is carried out in a vacuum. The resulting metal pattern adheres poorly to the substrate.

SUMMARY OF THE INVENTION

The present invention provides a method of forming a predetermined pattern on a substrate or support at atmospheric pressure, comprising the steps of:

(a) providing a laser beam having sufficient power to vaporize a specified pattern-forming material;

(b) providing an assembly comprising in the following order
  (i) a substrate which is transparent to the laser; and
  (ii) a smooth layer of the selected pattern-forming material;

(c) focusing the laser beam through the substrate at or near the interface of the pattern-forming material and the substrate to locally vaporize the pattern-forming material; and (d) moving the substrate and the laser beam relative to each other according to the predetermined pattern to selectively deposit the pattern-forming material on the substrate according to the predetermined pattern.

The method of this invention is carried out at atmospheric pressure. The necessity of supplying complicated vacuum means as required by the prior art is thus obviated. Moreover, the metal patterns formed using the method of this invention results in metal patterns which strongly adhere to the substrate. The only constraint on the method is the requirement that the substrate through which the laser beam is focused be transparent to the laser beam.

The method of this invention is useful in forming elements comprising a metal or a dye pattern on a substrate or a support. Such elements have obvious utility in the electronic manufacturing industry. They can be used to form elements comprising customized electrical circuits for use in electrical devices, such as integrated circuits.

Elements comprising dye patterns formed according to the method of this invention could be in the form of color filter arrays. Such color filter arrays have utility in a variety of electronic products including the reproduction of color images electronically.

DETAILS OF THE INVENTION

Figure 1:
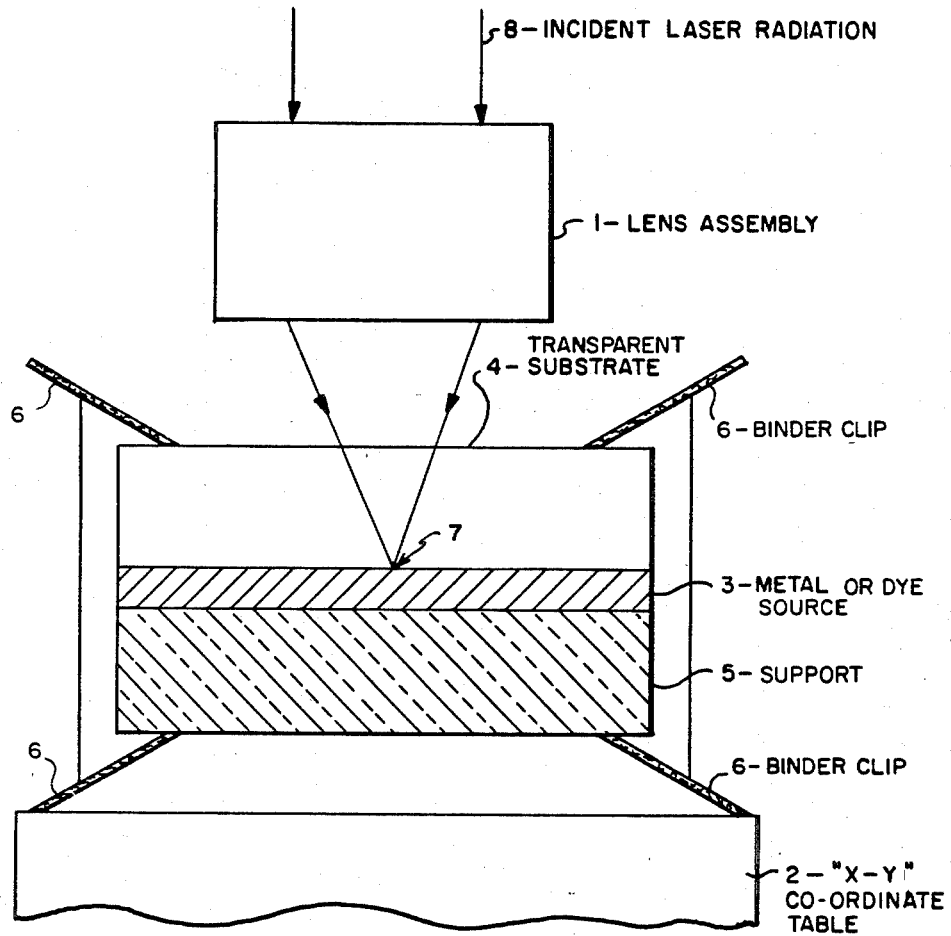
FIG. 1 is a schematic representative of a means for carrying out the method of this invention.

The method of this invention, means for carrying out the method and the resulting pattern bearing substrate is described in detail in the following paragraphs.

Referring to FIG. 1, a beam of infra-red incident radiation 8 emanating from a Q-switched Nd-YAG laser (not shown) is focused by a 60 mm focal lens assembly 1 into a direction normal to an "X-Y" co-ordinate table 2 on which is located a layer of pattern-forming material 3. In this illustration, the material is a metal, although it could be a sublimable dye. To achieve adequate transfer and good resultion of patterns formed on the substrate, the layer of pattern-forming material should be as smooth as possible thereby resulting in intimate contact with the substrate. Therefore, in one embodiment of the invention, a support is placed in contact with the pattern-forming material to form as smooth a layer as possible. In the latter embodiment, the assembly referred to above comprises in the following order:

(i) a substrate which is transparent to the laser;
(ii) a pattern forming material; and
(iii) a support.

The support need not be transparent to the laser. The support is especially useful for metal layers in the form of foils. Thicker metal layers in the form of plates can be used without a support. However, such metal layers must be smooth enough to form a good metal to substrate interface without air pockets in the interface.

The layer 3 is sandwiched between a transparent glass substrate 4 and a glass base support 5. The transparent substrate through which the laser is focused must not absorb the laser radiation. Thus, such substrate must be free of laser absorbing impurities. This substrate should also be sufficiently smooth to allow intimate contact with the pattern-forming material. The transparent substrate is held in intimate contact with the metal source material by means of adjustable binder clips 6. Irradiation through the transparent substrate with focusing at or near the transparent substratemetal interface 7 results in metal evaporation and subsequent nucleation on the transparent substrate 4. A line of metal is deposited on the substrate by moving the X-Y co-ordinate table 2 with respect to the focused radiation. The resulting deposited metallic line exhibits excellent adhesion to the glass substrate surface. The substrate, when separated from the support and the metal layer is useful as stated hereinbefore as an electronic device.

Scanning Electron Microscopy (SEM) was used to examine the various metals deposited on substrates by this technique. This examination showed that the excellent adhesion is a result of thermal "imbibing" of the vaporized metals into the localized molten surface region of the glass substrate. The depth of penetration of the metal into the glass has been measured by SEM to be as great as 30 μm. The depth is dependent on both the incident power of the laser beam and the specific metal used. The method was carried out at room temperature and required no vacuum.

The thickness of the metallic layer formed is dependent on the output power of the laser, the scan rate of the X-Y co-ordinate table and the specific source metal used. The output power of the Nd-YAG laser was varied between approximately 5 and 15W and the scanning rate was typically 5.08 mm/sec (approximately 0.20 inches/sec). Varying degrees of metallic transfer were observed at all power levels employed.

The line widths of the deposited metals varied between approximately 40 μm and 90 μm and were a function of the focusing optics and the corresponding laser output power. It will be clear to those skilled in the art that smaller line widths can be achieved with tighter focusing of laser beam optics.

Multiple laser scans (2 to 4×) over the same metal-glass interface areas resulted in greater metallic transfer to the transparent substrate for all metal sources examined.

Metals used as metal pattern-forming materials for the method included copper, silver, gold, aluminum, tungsten, palladium, molybdenum, nickel, tin and zinc. The copper, silver and aluminum were in the form of approximately 50.8 to 127 μm (2 to 5 mil) thick layers. The gold was in the form of 25.4 μm (1 mil) thick layers. The palladium and molybdenum were 0.5 mm thick layers. The nickel, tin, tungsten and zinc were each approximately 1 mm thick layers.

The palladium metal pattern made according to the described method on glass was shown to be catalytically active using the well-known tetrazolium salt (T-salt) process described, for example, in U.S. Pat. No. 4,042,392.

Chemically, the T-salt process proceeds as follows:

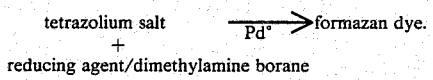

Our experiments showed that the deposited palladium pattern on glass was indeed catalytically active. The formazan dye formed by the palladium catalyzed reduction of the tetrazolium salt adhered to the Pd surface. This process is analogous to electroless deposition. This shows that such patterns can be subjected to physical development processes to further enhance the laser written pattern.

Other pattern-forming metals which can be used to deposit catalytically active patterns include Au°, Cu°, Pt°, Ni°, Ag°, Co°, etc.

Laser Induced Dye Transfer

A 0.2300 μm coating of copper phthalocyanine on 50.8×50.8 mm optical glass plate was prepared by a conventional vacuum deposition. A clear 50.8×50.8 mm slide cover glass was placed in direct contact with the coated side of the 0.2300 μm copper phthalocyanine layer and held in place by adjustable binder clamps. An Argon continuous wavelength laser operating at 48 and 514 nm was focused through the uncoated slide cover glass at the interface of the copper phthalocyanine coating and a clear cover glass substrate surface. In FIG. 1, the metal source 3 was replaced by the copper phthalocyanine layer vacuum coated on the glass support 5.

The laser output power was varied from approximately 0.3W to 4.5W. A line of the dye was deposited on the substrate by moving the X-Y co-ordinate table 2 with respect to the focused radiation. The mechanism for this dye transfer is essentially a dye sublimation followed by a rapid recondensation on the surface of the substrate 4.

Lower laser output powers approximately 0.3W to 1.5W resulted in more uniform dye transfer to the glass substrate. Optimum output power for dye transfer was approximately 1.5W. Line resolution of the dye lines was excellent.

Essentially, any sublimable dye will be useful in our process. Examples of other dyes include 1-hydroxy-4-(4-methoxyaniline)anthroquinone; 2-(4-diethylaminophenylazo)-4-trifluoromethylbenzothiazole and 6-(2,2-dicyanovinyl)-1-ethyl-2,2,4,7-tetramethyl-1,2,3,4,-tetrahydroquinolilne.

We also transferred copper phthalocyanine to a silicon wafer such as a polyester coated silicon wafer substrate, using a continuous wave Argon laser at output power levels of 0.25 to 1.7W (preferably between approximately 400 and 600 mW). A slightly modified experimental arrangement was utilized in this example. In this arrangement a 0.2300 μm copper phthalocyanine layer was vacuum coated on an optical glass substrate. The layer was placed in intimate contact with a polyester coated silicon wafer surface which served as the support 5. The incident laser radiation was focused at the dye layer silicon wafer interface. Transfer of the dye to the coated silicon wafer was accomplished through the sublimitation-recondensation mechanism. In this arrangement the incident laser irradiation did not pass through the support onto which the dye layer was transferred.

Although the foregoing description illustrates the movement of the pattern-forming material via the X-Y co-ordinate table while maintaining the laser beam stationary, it will be clear to those skilled in the art that the laser beam itself could be moved according to a predetermined pattern and the element kept stationary. Both the element and the laser beam could be computer instructed to move according to a predetermined pattern.

The invention has been described in detail with particular reference to preferred embodiments thereof, but it will be understood that variations and modifications can be effected within the spirit and scope of the invention.

We claim:

1. A method of forming a predetermined pattern on a substrate at atmospheric pressure, comprising the steps of:
    (a) providing a laser beam having sufficient power to vaporize a specified pattern-forming material;
    (b) providing an assembly comprising (i) a substrate which is transparent to the laser and which forms an intimate contact interface with (ii) a smooth layer of the selected pattern-forming material;
    (c) focusing the laser beam through the substrate at or near the interface of the patternforming material and the substrate to locally vaporize the pattern-forming material; and
    (d) moving the substrate and the laser beam relative to each other according to the predetermined pattern to selectively deposit the patternforming material on the substrate according to the predetermined pattern.

2. The method of claim 1 wherein the pattern-forming material is selected from the group consisting of metals and sublimable dyes.

3. The method of claim 1 wherein the pattern-forming material is selected from the group consisting of copper, silver, gold, aluminum, tungsten, palladium, molybdenum, nickel, tin, zinc and copper phthalocyanine.

4. The method of claim 1 wherein the assembly comprises in the following order:
   (i) a substrate which is transparent to the laser;
   (ii) a pattern forming material; and
   (iii) a support.

5. The method of claim 1 wherein the thickness of the pattern-forming layer is up to about 1 mm.

6. The method of claim 1 wherein the laser beam power is in the range of 0.3W to 15W.

7. The method of claim 1 wherein the pattern-forming material is a dye and the power of the laser beam is between 0.3W to 4.5W.

8. The method of claim 1 wherein the pattern-forming material is a metal and the power of the laser beam is approximately 5W to 15W.

9. The method of claim 1 wherein the resulting pattern is of a metal and the pattern is further subjected to a physical development process.

10. The method of claim 1 wherein the resulting pattern is of pallidium and the pattern is further subjected to a T-salt process.

11. The method of claim 1 wherein the predetermined pattern is an integrated circuit.

12. The method of claim 1 wherein the predetermined pattern is electrical interconnections between different parts of the substrate upon which the pattern resides.

* * * * *